(12) United States Patent
Ryu et al.

(10) Patent No.: US 9,142,662 B2
(45) Date of Patent: Sep. 22, 2015

(54) FIELD EFFECT TRANSISTOR DEVICES WITH LOW SOURCE RESISTANCE

(75) Inventors: Sei-Hyung Ryu, Cary, NC (US); Doyle Craig Capell, Hillsborough, NC (US); Lin Cheng, Chapel Hill, NC (US); Sarit Dhar, Cary, NC (US); Charlotte Jonas, Morrisville, NC (US); Anant Agarwal, Chapel Hill, NC (US); John Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/108,440

(22) Filed: May 16, 2011

(65) Prior Publication Data

US 2012/0280270 A1    Nov. 8, 2012

Related U.S. Application Data

(63) Continuation-in-part of application No. 13/102,510, filed on May 6, 2011, now Pat. No. 9,029,945.

(51) Int. Cl.
*H01L 29/78* (2006.01)
*H01L 29/06* (2006.01)
*H01L 29/739* (2006.01)
(Continued)

(52) U.S. Cl.
CPC ........ *H01L 29/7802* (2013.01); *H01L 29/0696* (2013.01); *H01L 29/7395* (2013.01); *H01L 29/045* (2013.01); *H01L 29/1608* (2013.01)

(58) Field of Classification Search
None
See application file for complete search history.

(56) References Cited

U.S. PATENT DOCUMENTS 3,439,189 A    4/1969   Petry
3,629,011 A   12/1971   Tohi et al.
(Continued)

FOREIGN PATENT DOCUMENTS

DE    39 42 640 A1    8/1990
DE    198 09 554      9/1998
(Continued)

OTHER PUBLICATIONS

Treu et al. In "A Surge Current Stable and Avanlanche Rugged SiC Merged pn Schotty Diode Blocking 600 V Especially suited for PFC Applications", 2005, Materials Science Forum, vol. 527-529, Abstract.*

(Continued)

*Primary Examiner* — Michael Jung
(74) *Attorney, Agent, or Firm* — Myers Bigel Sibley & Sajovec, P.A.

(57) ABSTRACT

A semiconductor device includes a drift layer having a first conductivity type, a well region in the drift layer having a second conductivity type opposite the first conductivity type, and a source region in the well region, The source region has the first conductivity type and defines a channel region in the well region. The source region includes a lateral source region adjacent the channel region and a plurality of source contact regions extending away from the lateral source region opposite the channel region. A body contact region having the second conductivity type is between at least two of the plurality of source contact regions and is in contact with the well region. A source ohmic contact overlaps at least one of the source contact regions and the body contact region. A minimum dimension of a source contact area of the semiconductor device is defined by an area of overlap between the source ohmic contact and the at least one source contact region.

25 Claims, 8 Drawing Sheets

(51) Int. Cl.
   *H01L 29/04* (2006.01)
   *H01L 29/16* (2006.01)

(56) References Cited

U.S. PATENT DOCUMENTS

| | | | |
|---|---|---|---|
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,581,542 A | 4/1986 | Steigerwald |
| 4,644,637 A | 2/1987 | Temple |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,703,383 A | 12/1997 | Nakayama |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,091,108 A * | 7/2000 | Harris et al. .................. 257/339 |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,344,676 B1 * | 2/2002 | Yun et al. .................. 257/401 |
| 6,365,462 B2 | 4/2002 | Baliga |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,534,367 B2 | 3/2003 | Farr et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,221,010 B2 | 5/2007 | Ryu |
| 7,230,275 B2 * | 6/2007 | Kumar et al. .................. 257/77 |
| 7,253,031 B2 | 8/2007 | Takahashi |
| 7,276,747 B2 | 10/2007 | Loechelt et al. |
| 7,279,115 B1 | 10/2007 | Sumakeris |

(56) References Cited

U.S. PATENT DOCUMENTS

| | | | |
|---|---|---|---|
| 7,304,363 B1 | 12/2007 | Shah | |
| 7,365,363 B2 | 4/2008 | Kojima et al. | |
| 7,381,992 B2 | 6/2008 | Ryu | |
| 7,407,837 B2 * | 8/2008 | Tsuji | 438/137 |
| 7,498,633 B2 | 3/2009 | Cooper et al. | |
| 7,528,040 B2 | 5/2009 | Das et al. | |
| 7,544,963 B2 | 6/2009 | Saxler | |
| 7,548,112 B2 | 6/2009 | Sheppard | |
| 7,649,213 B2 | 1/2010 | Hatakeyama et al. | |
| 7,687,825 B2 | 3/2010 | Zhang | |
| 7,728,402 B2 | 6/2010 | Zhang et al. | |
| 7,829,402 B2 * | 11/2010 | Matocha et al. | 438/197 |
| 7,855,384 B2 * | 12/2010 | Yamamoto et al. | 257/77 |
| 8,035,112 B1 | 10/2011 | Cooper et al. | |
| 2001/0011729 A1 | 8/2001 | Singh et al. | |
| 2001/0050383 A1 | 12/2001 | Hatade et al. | |
| 2001/0055852 A1 | 12/2001 | Moise et al. | |
| 2002/0030191 A1 | 3/2002 | Das et al. | |
| 2002/0038891 A1 | 4/2002 | Ryu et al. | |
| 2002/0047125 A1 | 4/2002 | Fukuda et al. | |
| 2002/0072247 A1 | 6/2002 | Lipkin et al. | |
| 2002/0102358 A1 | 8/2002 | Das et al. | |
| 2002/0121641 A1 | 9/2002 | Alok et al. | |
| 2002/0125482 A1 | 9/2002 | Friedrichs et al. | |
| 2002/0125541 A1 | 9/2002 | Korec et al. | |
| 2003/0025175 A1 | 2/2003 | Asano et al. | |
| 2003/0107041 A1 | 6/2003 | Tanimoto et al. | |
| 2003/0137010 A1 | 7/2003 | Friedrichs et al. | |
| 2003/0178672 A1 | 9/2003 | Hatakeyama et al. | |
| 2003/0201455 A1 | 10/2003 | Takahashi et al. | |
| 2004/0016929 A1 | 1/2004 | Nakatsuka et al. | |
| 2004/0082116 A1 | 4/2004 | Kub et al. | |
| 2004/0183079 A1 | 9/2004 | Kaneko et al. | |
| 2004/0211980 A1 | 10/2004 | Ryu | |
| 2004/0212011 A1 | 10/2004 | Ryu | |
| 2004/0256659 A1 | 12/2004 | Kim et al. | |
| 2004/0259339 A1 | 12/2004 | Tanabe et al. | |
| 2005/0012143 A1 | 1/2005 | Tanaka et al. | |
| 2005/0104072 A1 | 5/2005 | Slater, Jr. et al. | |
| 2005/0139936 A1 | 6/2005 | Li | |
| 2005/0151138 A1 | 7/2005 | Slater, Jr. et al. | |
| 2005/0181536 A1 | 8/2005 | Tsuji | |
| 2005/0230686 A1 | 10/2005 | Kojima et al. | |
| 2005/0275055 A1 | 12/2005 | Parthasarathy et al. | |
| 2006/0011128 A1 | 1/2006 | Ellison et al. | |
| 2006/0060884 A1 | 3/2006 | Ohyanagi et al. | |
| 2006/0086997 A1 | 4/2006 | Kanaya et al. | |
| 2006/0211210 A1 | 9/2006 | Bhat et al. | |
| 2006/0216896 A1 * | 9/2006 | Saito et al. | 438/270 |
| 2006/0244010 A1 | 11/2006 | Saxler | |
| 2006/0255423 A1 | 11/2006 | Ryu et al. | |
| 2006/0261347 A1 | 11/2006 | Ryu et al. | |
| 2006/0261876 A1 | 11/2006 | Agarwal et al. | |
| 2006/0267021 A1 | 11/2006 | Rowland et al. | |
| 2006/0270103 A1 | 11/2006 | Das et al. | |
| 2007/0066039 A1 | 3/2007 | Agarwal et al. | |
| 2007/0120148 A1 | 5/2007 | Nogome | |
| 2007/0164321 A1 | 7/2007 | Sheppard | |
| 2007/0241427 A1 | 10/2007 | Mochizuki et al. | |
| 2007/0262324 A1 | 11/2007 | Kaneko | |
| 2008/0001158 A1 | 1/2008 | Das et al. | |
| 2008/0006848 A1 | 1/2008 | Chen et al. | |
| 2008/0029838 A1 | 2/2008 | Zhang et al. | |
| 2008/0048258 A1 | 2/2008 | de Fresart et al. | |
| 2008/0105949 A1 | 5/2008 | Zhang et al. | |
| 2008/0191304 A1 | 8/2008 | Zhang et al. | |
| 2008/0230787 A1 | 9/2008 | Suzuki et al. | |
| 2008/0251793 A1 | 10/2008 | Mazzola et al. | |
| 2008/0277669 A1 | 11/2008 | Okuno et al. | |
| 2008/0296771 A1 | 12/2008 | Das et al. | |
| 2009/0008709 A1 | 1/2009 | Yedinak et al. | |
| 2009/0101918 A1 | 4/2009 | Uchida et al. | |
| 2009/0121319 A1 | 5/2009 | Zhang et al. | |
| 2009/0146154 A1 * | 6/2009 | Zhang et al. | 257/77 |
| 2009/0212301 A1 | 8/2009 | Zhang et al. | |
| 2009/0272982 A1 | 11/2009 | Nakamura et al. | |
| 2009/0289262 A1 | 11/2009 | Zhang et al. | |
| 2009/0321746 A1 * | 12/2009 | Harada et al. | 257/77 |
| 2010/0032685 A1 | 2/2010 | Zhang et al. | |
| 2010/0133549 A1 | 6/2010 | Zhang et al. | |
| 2010/0133550 A1 | 6/2010 | Zhang et al. | |
| 2010/0140628 A1 | 6/2010 | Zhang | |
| 2010/0163888 A1 | 7/2010 | Saggio et al. | |
| 2010/0244047 A1 | 9/2010 | Hull et al. | |
| 2010/0295062 A1 | 11/2010 | Uchida et al. | |
| 2011/0012132 A1 * | 1/2011 | Otsuka et al. | 257/77 |
| 2011/0018004 A1 | 1/2011 | Shimizu et al. | |
| 2011/0018040 A1 | 1/2011 | Smith et al. | |
| 2011/0101375 A1 | 5/2011 | Zhang | |

FOREIGN PATENT DOCUMENTS

| | | |
|---|---|---|
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693 896 A1 | 8/2006 |
| EP | 1 806 787 A1 | 7/2007 |
| EP | 1 845 561 A2 | 10/2007 |
| EP | 2 015 364 | 1/2009 |
| EP | 2 124 257 A1 | 11/2009 |
| JP | 60-240158 | 11/1985 |
| JP | 01117363 | 5/1989 |
| JP | 03034466 | 2/1991 |
| JP | 03157974 | 7/1991 |
| JP | 3-225870 | 10/1991 |
| JP | 08264766 | 10/1996 |
| JP | H08-340103 A | 12/1996 |
| JP | 09205202 | 8/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2000106371 A | 4/2001 |
| JP | 2001-352061 A | 12/2001 |
| JP | 2002-314099 | 10/2002 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |
| WO | WO 2007/135940 A1 | 11/2007 |
| WO | WO2009128382 A1 * | 10/2009 ............ H01L 29/78 |

(56) References Cited

FOREIGN PATENT DOCUMENTS

| WO | WO 2010004715 A1 * | 1/2010 | ............. H01L 29/78 |
| WO | WO 2010/074275 A1 | 7/2010 | |

OTHER PUBLICATIONS

Tone et al. In "4H-SiC Normally-Off Vertical Junction Field-Effect Transistor With Hight Current Density", 2003, Electron Device Letters, IEEE, vol. 24, Issue 7, pp. 463-465.*
Salem et al. In "High-Temperature High-Power Operation of a 100 a SiC DMOSFET Module", 2009, Applied Power Electronics Conference and Exposition, APEC 2009. Twenty-Fourth Annual IEEE, pp. 653-657.*
Miura et al. In "Successful Development of 1.2 kV 4H-SiC MOSFETs with the Very Low on-Resistance of 4mOhmcm2", 2006, Power Semiconductor Devices and IC's 2006, ISPSD 2006, IEEE International Symposium, pp. 1-4.*
Agarwal et al. In 700 V Asymmetrical 4H-SiC Gate Turn-Off Thyristors (GTO's), 1997, Electron Device Letters, vol. 18, Issue 11, pp. 518-520.*
Chang In "500-V n-channel insulated-gate bipolar transistor with a trench gate structure", 1989, Electron Devices, IEEE Transactions, vol. 36, Issue 9, pp. 1824-1829.*
Zhang et al. In "12 kV 4H-SiC p-IGBT with Record Low Specific On-Resistance", 2008, Material Science Forum, vol. 600-603, Abstract.*
Tamaki et al. In "Optimization of ON-State and Switching Performances for 15-20-kV 4H-SiC IGBTs", Electron Devices, IEEE Transactions, vol. 55, Issue 8, pp. 1920-1927.*
Definition of overlap. (n.d.) The American Heritage® Dictionary of the English Language, Fourth Edition. (2003). Retrieved Jan. 11, 2013 from http://www.thefreedictionary.com/overlap.*
"Insulated-gate bipolar transistor." *Wikipedia, the Free Encyclopedia*. Web. Jun. 21, 2010. http://en.wikipedia.org.
A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.
A.K. Agarwal, J.B. Casady, L.B. Rowland, W.F. Valek, M.H. White, and C,D. Brandt, "1.1 kV 4H-SiC Power UMOSFET's," *IEEE Electron Device Letters*, vol. 18, No. 12, pp. 586-588, Dec. 1997.
A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.
A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.
A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.
Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.
Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.
Ayalew, T, "Dissertation of Tesfaye Ayalew", Section 4,4.3.1 MPS Diode Structure, *SiC Semiconductor Devices Technology, Modeling, and Simulation*, 2006.
Baliga "Insulated Gate Biopolar Transistor" *Power Semiconductor Devices*. PWS Publishing Company, Boston, MA. 426-502 (1996).
Baliga "Power MOSFET" *Power Semiconductor Devices*. PWS Publishing Company, Boston, MA 335-425 (1996).
Baliga, Power Semiconductor Devices, Chapter 7, PWS Publishing, 1996.
Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294.
Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).
Chakraborty et al. "Interface Properties of $N_2O$-annealed $SiO_2$/SiC system," *Proceedings IEEE Hong Kong Electron Devices Meeting*. Jun. 24, 2000, pp. 108-111.
Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.
Chen et al. "Theoretical Analysis of Current Crowding Effect in Metal/AlGaN/GaN Schottky Diodes and Its Reduction by Using Polysilicon in Anode," Chin. Phys. Lett., vol. 24, No. 7 (2007) pp. 2112-2114.
Chinese Office Action dated Jan. 22, 2010, corresponding to Chinese Patent Application No. 200780029460.5, 7 pages.
Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).
Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.
Chung et al., "The Effect of Si:C Source Ratio on $SiO_2$/SiC Interface State Density for Nitrogen Doped 4H and 6H-SiC," *Materials Science Forum*. (2000) vols. 338-342, pp. 1097-1100.
International Search Report and Written Opinion for corresponding International Application No. PCT/US2004/004982, dated Jul. 22, 2004.
International Search Report for PCT/US01/30715.
International Search Report for PCT/US01/42414, dated Apr. 23, 2002.
International Search Report for PCT/US02/11691 dated Dec. 4, 2002.
D. Alok, E. Arnold, and R. Egloff, "Process Dependence of Inversion Layer Mobility in 4H-SiC Devices," *Materials Science Forum*, vols. 338-342, pp. 1077-1080, 2000.
Dahlquist et al. "A 2.8kV, Forward Drop JBS Diode with Low Leakage," *Materials Science Forum*, vols. 338-342, (2000) pp. 1179-1182.
Das, Mrinal K. Graduate thesis entitled, *Fundamental Studies of the Silicon Carbide MOS Structure*. Purdue University, 1999.
Dastidar, Sujoyita, A Study of P-Type Activation in Silicon Carbide, Thesis (Purdue University, May 1998).
De Meo et al., "Thermal Oxidation of SiC in $N_2O$", *J. Electrochem. Soc.*, vol. 141, 1994, pp. L150-L152.
del Prado et al. "Full Composition Range Silicon Oxynitride Films Deposited by ECR-PECVD at Room Temperatures," *Thin Solid Films*. vol. 343-344 (1999) p. 437-440.
Dimitrijev et al., "Nitridation of Silicon-Dioxide Films Grown on 6H Silicon Carbide", *IEEE Electronic Device Letters*, vol. 18, No. 5, May 5, 1997, pp. 175-177.
European Search Report for corresponding EP patent application No. 09177558.5 dated Feb. 22, 2010.
European Search Report for corresponding EP patent application No. 09163424.6 dated Apr. 9, 2010.
European Search Report; Application No. EP07120038; Jun. 16, 2008.
Extended European Search Report (12 pages) corresponding to European Application No. 07112298; Dated Feb. 18, 2009.
Fisher, C.A. et al., "The performance of high-voltage field relieved Schottky barrier diodes", IEE Proceedings, vol. 132:6, Pt. I, pp. 257-260 (Dec. 1985).
Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

(56) References Cited

OTHER PUBLICATIONS

Fukuda et al. "Improvement of $SiO_2$/4H-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.
G.Y. Chung, C.C. Tin, J.R. Williams, K. McDonald, M. Di Ventra, S.T. Pantelides, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.
G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.
H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.
http://www.elec.gla.ac.uk; *The Insulated Gate Bipolar Transistor (IGBT)*; Feb. 14, 2007.
Hubei, K, "Hybrid design improves diode robustness and boosts efficiency," Compoundsemiconductor.net, 2006.
Hull et al., "Drift-Free 10-kV, 20-A 4H-SiC PiN Diodes," Journal of Electronic Materials, vol. 34, No. 4, 2005, pp. 341-344.
International Preliminary Report on Patentability (9 pages) corresponding to International Application No. PCT/US2007/010192; Mailing Date: Sep. 23, 2008.
International Search Report and Written Opinion (13 pages) corresponding to International Application No. PCT/US2008/010538; Mailing Date: Dec. 22, 2008.
International Search Report and Written Opinion (14 pages) corresponding to International Application No. PCT/US2010/020071; Mailing Date: Mar. 26, 2010.
International Search Report and Written Opinion (14 pages) corresponding to International Application No. PCT/US2009/065251; Mailing Date: Jun. 1, 2010.
International Search Report and Written Opinion (16 pages) corresponding to International Application No. PCT/US2009/003089; Mailing Date: Aug. 20, 2009.
International Search Report and Written Opinion for PCT/US2007/014139; Feb. 4, 2008.
International Search Report and Written Opinion for PCT/US2010/025053 mailed on Jul. 2, 2010.
International Search Report and Written Opinion, International Application No. PCT/US2009/000734, Apr. 23, 2009.
International Search Report, PCT/US2008/008574, Sep. 26, 2008.
Invitation to Pay Additional Fees for PCT/US2007/010192; Oct. 29, 2007.
Invitation to Pay Additional Fees for PCT/US2010/025053 mailed on May 3, 2010.
J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.
J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.
J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.
J.T. Richmond, S. Ryu, A.K. Agarwal and J.W. Palmour, "Hybrid 4H-SiC MOS Gated Transistor (MGT)" (admitted prior art).
Jamet, et al. "Physical properties of $N_2O$ and NO-nitrided gate oxides grown on 4H SIC," *Applied Physics Letters*. vol. 79, No. 3, Jul. 16, 2001, pp. 323-325.
K. Ueno and Tadaaki Oikawa, "Counter-Doped MOSFET's of 4H-SiC," *IEEE Electron Device Letters*, vol. 20, No. 12, pp. 624-626, Dec. 1999.
K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.
Kinoshita et al., "Guard Ring Assisted RESURF: A New Termination Structure Providing Stable and High Breakdown Voltage for SiC Power Devices, "Tech. Digest of ISPSD '02, pp. 253-256.
Kobayashi et al. "Dielectric Breakdown and Current Conduction of Oxide/Nitride/Oxide Multi-Layer Structures," *1990 IEEE Symposium on VLSI Technology*. pp. 119-120.
Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.
L.A. Lipkin and J.W. Palmour, "Low interface state density oxides on p-type SiC," Materials Science Forum vols. 264-268, pp. 853-856, 1998.
Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.
Leonhard et al. "Long term stability of gate-oxides on n- and p-type silicon carbide studied by charge injection techniques," *Materials Science Engineering*, vol. 46, No. 1-3, Apr. 1997, pp. 263-266.
Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.
Lipkin et al. "Insulator Investigation on SiC for Improved Reliability," *IEEE Transactions on Electron Devices*. vol. 46, No. 3, Mar. 1999, pp. 525-532.
Lipkin et al. "Challenges and State-of-the-Art Oxides in SiC," *Mat. Res. Soc. Symp. Proc.* vol. 640, 2001, pp. 27-29.
Losee et al., "Degraded Blocking Performance of 4H-SiC Rectifiers Under High dV/dt Conditions", Proceedings of $17^{th}$ International Symposium on Power Semiconductor Devices & IC's, 4 pages (May 23-26, 2005). XP010820730.
Losee et al., "High-Voltage 4H-SiC PiN Rectifiers with Single-Implant, Multi-Zone JTE Termination", Power Semiconductor Devices and ICs, 2004 Proceedings. ISPSB '04. The $16^{th}$ International Symposium on Kitakyushu Int. Conf. Center, Japan May 24-27, 2004, Piscataway, NJ, USA, IEEE, May 24, 2004, pp. 301-304, XP010723398.
M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.
M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.
M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.
M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.
Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.
Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.
Motorola Power MOSFET Transistor Databook, 4th edition. Motorola, INc., 1989, pp. 2-5-4-2-5-7.
Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

(56) References Cited

OTHER PUBLICATIONS

Myer-Ward et al. "Turning of Basal Plane Dislocations During Epitaxial Growth on 4 off-axis 4h-SiC" *7th European Conference on Silicon Carbide and Related Materials*, Barcelona-Spain, Sep. 7-11, 2008 retrieved from http://ecscrm08.com/invited_presentations.html., retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 $m\Omega\text{-}cm^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. $2^{nd}$ Edition, © 2002 John Wiley and Sons, p. 130.

S.M. Sze Semiconductor Devices. Physics and Technology. $2^{nd}$ Edition, © 2002 John Wiley and Sons, p. 130.

S.T. Pantelides, "Atomic Scale Engineering of SiC Dielectric Interfaces," DARPA/MTO High Power and Onr Power Switching MURI Reviews, Rosslyn, VA, Aug. 10-12, 1999.

Senzaki et al. "Effects of Pyrogenic Reoxidation Annealing on Inversion Channel Mobility of 4H-SiC Metal-Oxide-Semiconductor Field-Effect Transistor Fabricated on (1120) Face", *Japanese Journal of Applied Physics*, Japan Society of Applied Physics, Tokyo, JP; vol. 40, No. 11B, Part 2; Nov. 2001, pp. L1201-L1203.

Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

(56) References Cited

OTHER PUBLICATIONS

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol.* (a), vol. 162, pp. 321-337, 1997.

Vassilevski et al., "Protection of selectively implanted and patterned silicon carbide surfaces with graphite capping layer during post-implantation annealing," Institute of Physics Publishing, Semicond. Sci. Technol. 20 (2005) 271-278.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2O$-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Y. Wang, C. Weitzel, and M. Bhatnagar, "Accumulation-Mode SiC Power MOSFET Design Issues," *Materials Science Forum*, vols. 338-342, pp. 1287-1290.

Yilmaz, "Optimization and Surface Charge Sensitivity of High Voltage Blocking Structures with Shallow Junctions, "IEEE Transactions on Electron Devices, vol. 38, No. 3, Jul. 1991, pp. 1666-1675.

Zhang et al. "Design and Fabrication of High Voltage IGBTs on 4H-SiC", Power Semiconductor Devices and IC's, 2006 IEEE International Symposium on Naples, Italy; Jun. 4-8, 2006; pp. 1-4.

Zhang et al., "A 10-kV Monolithic Darlington Transistor with βforced of 336 in 4H-SiC," IEEE Electron Device Letters, vol. 30, No. 2, Feb. 2009, pp. 142-144.

Agarwal et al., "9kV, 1 cm×1 cm SiC Super GTO Technology Development for Pulse Power", 2009, Pulsed Power Conference, PPC '09, IEEE, pp. 264-269.

International Search Report Corresponding to International Application No. PCT/US12/27255; Date of Mailing: Jun. 13, 2012; 13 Pages.

Definition of overlap (n.d.) The American Heritage Dictionary of the English Language, Fourth Edition (2003), Retrieved Feb. 6, 2013 from http://www.thefreedictionary.com/overlap.

European Extended Search Report Corresponding to European Patent Application No. 12 78 2360; Dated: Oct. 7, 2014; 7 Pages.

Japanese Office Action Corresponding to Japanese Patent Application No. 2014-509288; Mailing Date: Nov. 25, 2014; Foreign Text, 4 Pages, English Translation Thereof, 4 Pages.

Kazuhiro et al. "Simultaneous Formation of Ni/Al Ohmic Contacts to Both n- and p-Type 4H-SiC", *Journal of Electronic Materials*, vol. 37, No. 11, 2008, pp. 1674-1680.

\* cited by examiner

FIELD EFFECT TRANSISTOR DEVICES WITH LOW SOURCE RESISTANCE

CROSS REFERENCE TO RELATED APPLICATION

The present application is a continuation in part of U.S. application Ser. No. 13/102,510, filed May 6, 2011 now U.S. Pat. No. 9,029,945, entitled "FIELD EFFECT TRANSISTOR DEVICES WITH LOW SOURCE RESISTANCE", the disclosure of which is incorporated herein by reference in its entirety.

STATEMENT OF U.S. GOVERNMENT INTEREST

This invention was made with Government support under Contract No. DAAD19-01-C-0067 awarded by Army Research Laboratory. The Government has certain rights in the invention.

FIELD OF THE INVENTION

The present invention relates to electronic devices and fabrication methods. More particularly, the present invention relates to high power insulated gate transistors and fabrication methods.

BACKGROUND

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications, e.g., up to 10 kV or more.

SiC DMOSFET devices with a 10 kV blocking capability have been fabricated with a specific on-resistance of about 100 mΩ×cm$^2$. DMOSFET devices may exhibit very fast switching speeds of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4H—SiC PiN Diodes", Journal of Electrical Materials, Vol. 34, No. 4, 2005. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4H—SiC insulated gate bipolar transistors (IGBTs) are becoming more suitable for power switching applications.

SUMMARY

A semiconductor device according to some embodiments includes a drift layer having a first conductivity type, a well region in the drift layer having a second conductivity type opposite the first conductivity type, and a source region in the well region. The source region has the first conductivity type and defines a channel region in the well region. The source region includes a lateral source region adjacent the channel region and a plurality of source contact regions extending away from the lateral source region opposite the channel region. A body contact region having the second conductivity type is between at least two of the plurality of source contact regions and is in contact with the well region, and a source ohmic contact is in contact with the source contact regions and the body contact region.

The body contact region may include a plurality of body contact regions that are interspersed between the source contact regions. The plurality of body contact regions may be spaced apart from the channel region by the lateral source region.

The source ohmic contact may be in contact with the source region in a source contact area and the source ohmic contact may be in contact with the body contact region in a body contact region area.

In some embodiments, a ratio of a minimum dimension p1 of the contact region area to a minimum dimension w1 of the well region may be greater than 0.2. In further embodiments, the ratio of the minimum dimension p1 of the contact region area to the minimum dimension w1 of the well region may be greater than about 0.3.

The drift region may include a wide bandgap semiconductor material, such as silicon carbide.

The source region has a sheet resistance and the source ohmic contact has a sheet resistance that is greater than 75% of the contact resistance of the source region, and in some embodiments is greater than the contact resistance of the source region.

The device may have a reverse blocking voltage in excess of 1000 volts and a current density greater than 200 amps per square centimeter.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
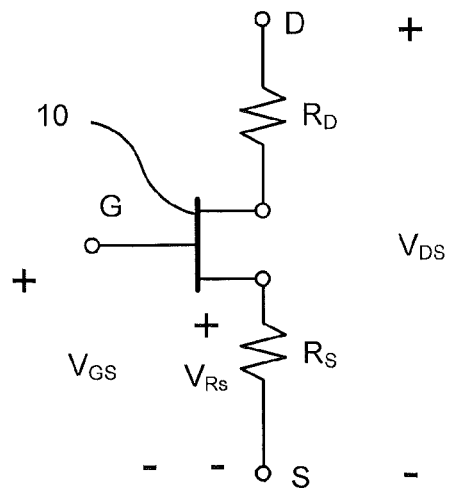
FIG. 1 is a circuit diagram of a metal-oxide-semiconductor field effect (MOSFET) device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Some embodiments of the invention provide silicon carbide (SiC) insulated gate devices that are suitable for high power and/or high temperature applications.

FIG. 1 is a circuit diagram of a metal oxide semiconductor field effect transistor (MOSFET) device 10. As shown therein, a MOSFET device generally includes three terminals, namely, a drain terminal (D), a source terminal (S) and a gate terminal (G). The gate-to-source voltage of the device is denoted $V_{GS}$, while the drain-to-source voltage of the device is denoted $V_{DS}$. The device has a built in source resistance $R_S$ and a built-in drain resistance $R_D$ based on the physical characteristics of the device. The voltage over the built-in source resistance $R_S$ is denoted $V_{Rs}$.

In a MOSFET device, current passing through a channel of the device from the drain to the source is regulated by applying a voltage to the gate. The gate is insulated from the channel by a gate insulator, such as silicon dioxide. As the voltage on the gate terminal is increased, current passing through the device may increase.

Figure 2:
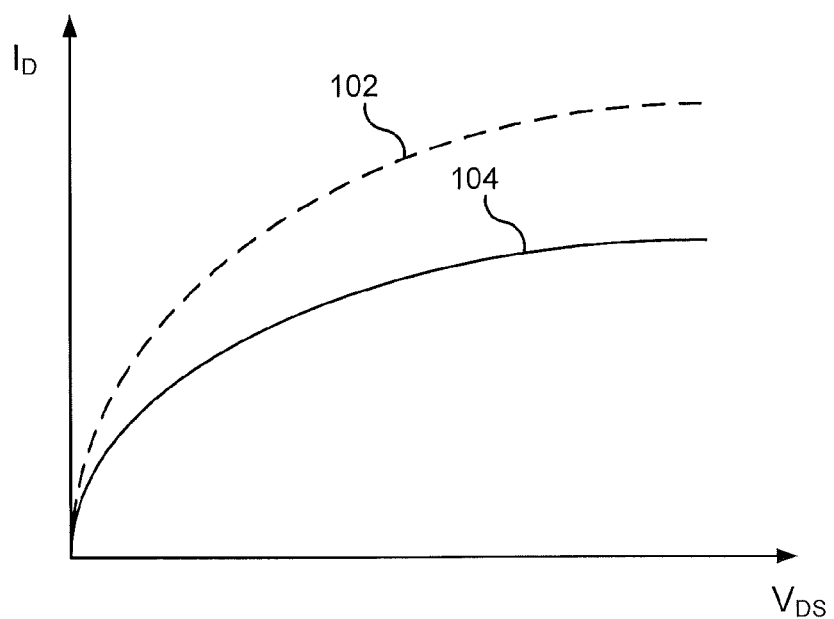
FIG. 2 is a graph illustrating hypothetical on-state current-voltage characteristics for a MOSFET device.

FIG. 2 is a graph illustrating hypothetical (curve 102) and actual (104) on-state current-voltage characteristics for a MOSFET device for a given gate-to-source voltage ($V_{GS}$). As shown in FIG. 2, for a given gate voltage, the current through the device ($I_D$) increases as the voltage between the drain and source ($V_{DS}$) increases, up to a saturation point. In actual devices, the actual saturation current of a transistor is typically less than the ideal saturation current. Part of the reason for this relates to the source resistance of the device.

Figure 3:
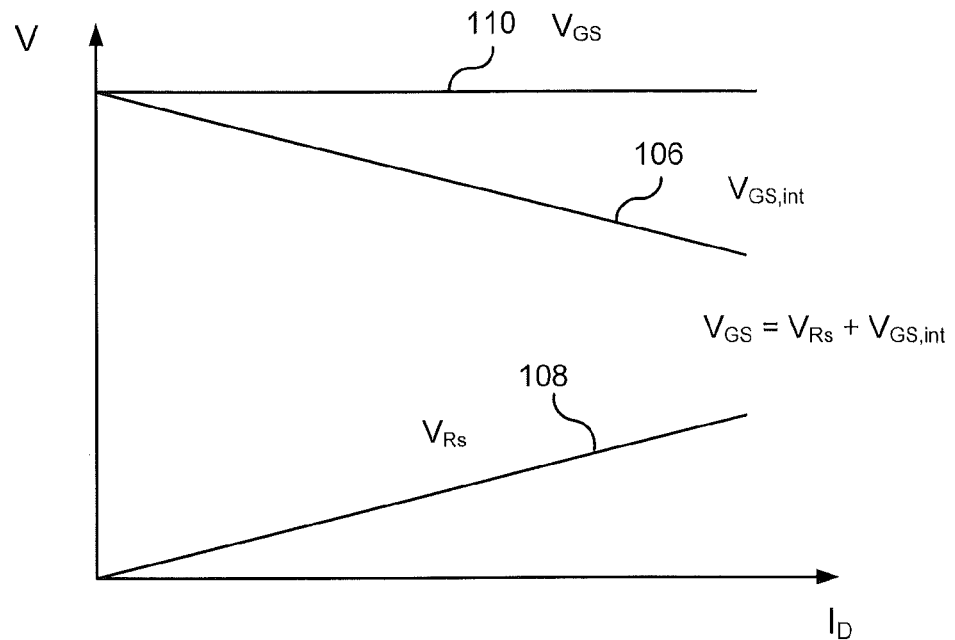
FIG. 3 is a graph illustrating the effect of source resistance on gate voltage.

In particular, as the drain current $I_D$ passing through the device increases, the amount of voltage dropped over the source resistance $R_S$ increases in direct proportion. FIG. 3 is a graph illustrating the effect of source resistance on gate voltage. In FIG. 3, the voltage from the gate terminal to the source terminal is denoted $V_{GS}$. A portion of the gate voltage $V_{GS}$ applied to the device across the gate and source terminals is dropped over the internal source resistance $R_S$ of the device. That portion of the gate voltage is denoted $V_{Rs}$ in FIG. 3. The remainder of the gate-to-source voltage appears as a voltage across the gate insulator, denoted $V_{Gs,int}$ in FIG. 3. Thus, $V_{GS}$ is equal to the sum of $V_{Rs}$ and $V_{Gs,int}$.

As shown in FIG. 3, the gate-to-source voltage may remain constant as the drain current increases. However, the portion of the gate voltage $V_{GS}$ that is dropped over the internal source resistance of the device, $V_{Rs}$, increases as the drain current $I_D$ increases, while the portion of the gate-to-source voltage that appears as a voltage across the gate insulator, $V_{GS,int}$, decreases as the drain current $I_D$ increases.

Thus, as the drain current increases the portion of the gate voltage that is being used to maintain the channel decreases, which may cause the device to go into saturation at a lower level of drain-to-source voltage. Accordingly, a high source resistance can adversely affect the operation of a MOSFET or other insulated gate controlled device.

Figure 4:
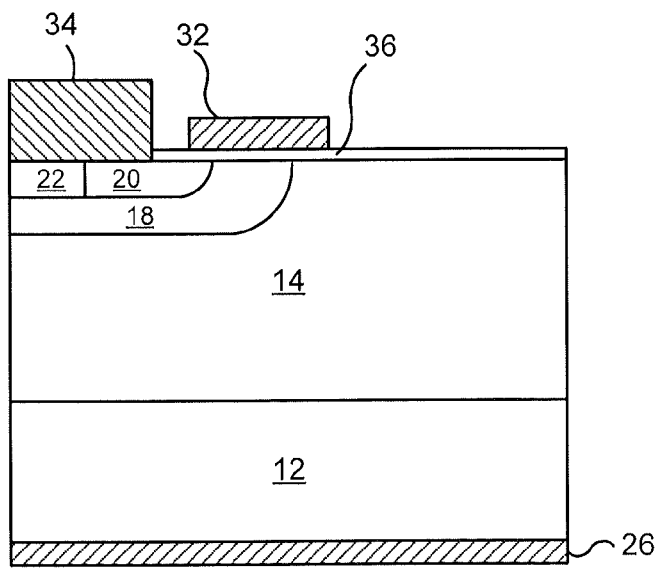
FIG. 4 is a partial cross sectional illustration of cell of a conventional power MOSFET device.

A unit cell 10 of a MOSFET structure according to some embodiments is shown in FIG. 4. The device 10 of FIG. 1 includes an n– drift epitaxial layer 14 on an n-type, 8° off-axis 4H—SiC substrate 12. The n– drift layer 14 may have a thickness of about 100 μm to about 120 μm, and may be doped with n-type dopants at a doping concentration of about $2\times10^{14}$ cm$^{-3}$ to about $6\times10^{14}$ cm$^{-3}$ for a blocking capability of about 10 kV. Other doping concentrations/voltage blocking ranges are also possible. For a 1200V MOSFET device, the substrate may be 4° off-axis 4H—SiC and the drift layer may have a thickness of about 10 μm and may be doped with n-type dopants at a doping concentration of about $6\times10^{15}$ cm$^{-3}$.

The structure further includes a p+ well region 18 and an n+ source region 20 that may be formed by selective implantation of, for example, aluminum and nitrogen, respectively. The junction depth of the p+ well region 18 may be about 0.5 μM, although other depths are possible. The structure 10 further includes a p+ contact region 22 that extends from a surface of the drift layer 14 into the p+ well region 18. A junction termination (not shown) may be provided around the device periphery.

All of the implanted dopants may be activated by annealing the structure at a temperature of about 1600° C. with a silicon over pressure and/or covered by an encapsulation layer such as a graphite film. A high temperature anneal may damage the surface of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 μm. The graphite coating may be heated to form a crystalline coating on the drift layer 14. The implanted ions may be activated by a thermal anneal that may be performed, for example, in an inert gas at a temperature of about 1600° C. or greater. In particular the thermal anneal may be performed at a temperature of about 1600° C. in argon for 5 minutes. The graphite coating may help to protect the surface of the drift layer 14 during the high temperature anneal.

The graphite coating may then be removed, for example, by ashing and thermal oxidation.

After implant annealing, a field oxide of silicon dioxide (not shown) having a thickness of about 1 μm may be deposited and patterned to expose the active region of the device.

A gate oxide layer 36 may be formed by a gate oxidation process, with a final gate oxide thickness of 400-600 Å.

In particular, the gate oxide may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting gate oxide layer may have a thickness of about 500 Å.

In some embodiments, the dry $O_2$ oxide growth may be performed at a temperature of about 1175° C. in dry $O_2$ for about 4 hours. The resulting oxide layer may be annealed at a temperature of up to about 1175° C. in an inert atmosphere. In particular, the resulting oxide layer may be annealed at a temperature of about 1175° C. in Ar for about a time duration ranging from 30 min to 2 hours. Then the oxide layer receives an anneal in NO ambient at a temperature ranging from 1175° C. to 1300 C, for a duration ranging from 30 minutes to 3 hours. The resulting gate oxide layer may have a thickness of about 500 Å.

After formation of the gate oxide 36, a polysilicon gate 32 may be deposited and doped, for example, with boron followed by a metallization process to reduce the gate resistance. Al/Ni contacts may be deposited as the p-type ohmic source contact metal 28, and Ni as the n-type drain contact metal 26. All contacts may be sintered in a Rapid Thermal Annealer (RTA), and thick Ti/Au layers may be used for pad metals.

Referring to FIG. 4, the source resistance of a MOSFET device has two primary components, namely, the contact resistance $R_C$ between the source ohmic contact 34 and the source region 20, and the sheet resistance $R_{sheet}$ in the source region 20 between the source ohmic contact 34 and the channel. Thus, $R_S = R_C + R_{sheet}$. In a conventional silicon-based MOSFET device, the sheet resistance $R_{sheet}$ is the dominant factor in determining the source resistance, because it is possible to form very low resistivity ohmic contacts to silicon and other narrow-bandgap semiconductors. However, in wide bandgap semiconductors (i.e., semiconductors having a bandgap greater than about 2.0 V), including compound semiconductor materials, such as silicon carbide and gallium nitride, diamond, and ZnO, the contact resistance $R_C$ may be the dominant contributor to the source resistance. In particular, it is difficult to form very low resistivity ohmic contacts to silicon carbide and other wide bandgap materials because of the high energy barrier associated with such materials.

Figure 5:
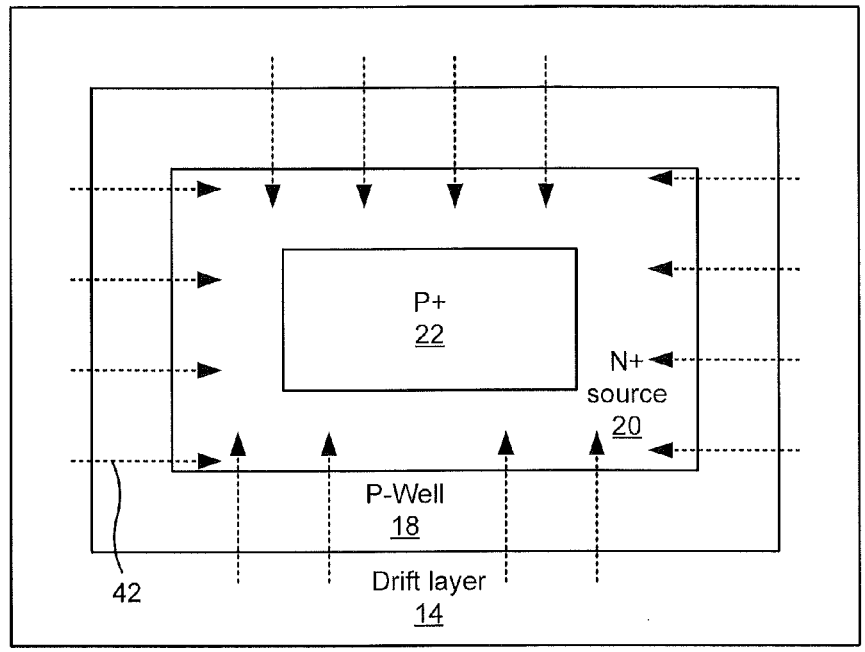
FIGS. 5 and 6 are plan views illustrating layouts of conventional power MOSFET devices.
Figure 6:
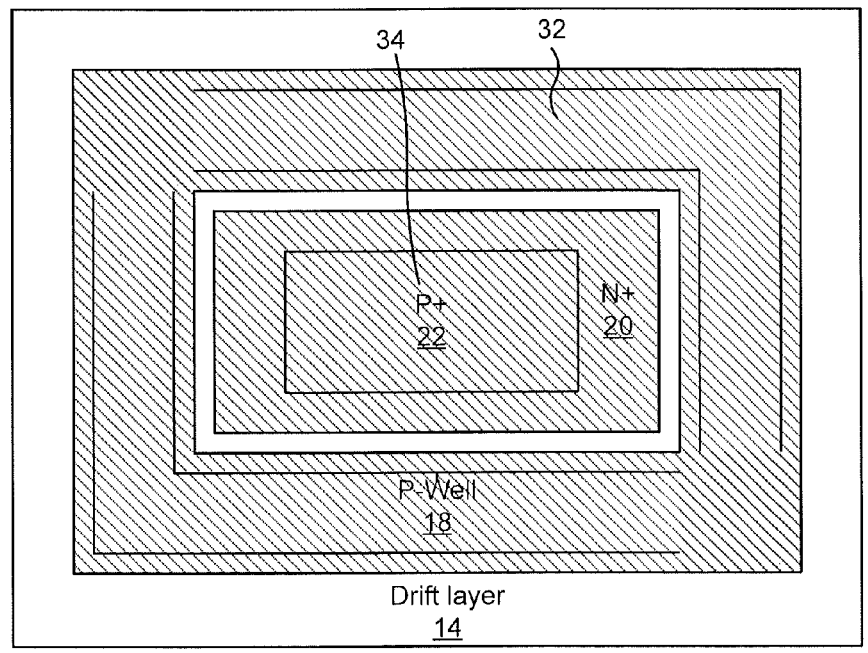

FIGS. 5 and 6 are plan views illustrating layouts of conventional power MOSFET devices. In a conventional power MOSFET device, the layout is designed to reduce or minimize sheet resistance under the assumption that contact resistance is less important than sheet resistance. Thus, referring to FIG. 5, a conventional power MOSFET device typically includes a p-well 18 formed in a drift layer 14, an n+ source region 20 in the p-well 18, and a p+ contact region 22 in the n+ source region 20. Referring to FIG. 6, a source contact 34 is formed on the n+ source region 20 and the p+ contact region 22. A gate 32 is formed over the p-well 18 and overlaps the periphery of the n+ source region 20 and adjacent portions of the drift layer 14. Current flow from the drain to the source is indicated by the arrows 42 in FIG. 5.

As noted above, in a wide bandgap semiconductor material system, the source resistance may be more affected by the contact resistance of the source ohmic contact than by the sheet resistance of the source layer. Accordingly, to decrease the source resistance of a wide bandgap power semiconductor device, it may be desirable to decrease the contact resistance of the source ohmic contact. In general, contact resistance can be decreased by increasing the minimum dimension of the contact, which is the smallest dimension of the contact in any direction. However, simply increasing the minimum dimension of the source ohmic contact of an electronic device can undesirably increase the cell to cell spacing, or pitch, of the device. The pitch of a MOSFET device may be proportional to the width of the p-well region of the device. Increasing the pitch of the device reduces the density of the devices that can be formed on a single substrate, reducing the devices yielded and increasing manufacturing costs.

According to some embodiments, an insulated gate device layout is provided that increases the minimum dimension of the source ohmic contact without increasing the pitch of the device and/or the width of the p-well region of the device. A device layout according to some embodiments may increase the sheet resistance of the device. Such an effect may be highly undesirable in a device based on a narrow bandgap semiconductor material. However, since sheet resistance is not the dominant factor in determining source resistance of a wide bandgap device, such a tradeoff may be acceptable for wide bandgap devices. In devices according to some embodiments, a ratio of the source sheet resistance to the source contact resistance may be greater than 0.75 (i.e. $R_{sheet}/R_C > 0.75$). In some embodiments, the device may have a source contact resistance that is less than the source sheet resistance. That is, in some embodiments, the ratio of the source sheet resistance to the source contact resistance may be greater than 1 (i.e. $R_{sheet}/R_C > 1$), and in further embodiments, the ratio of the source sheet resistance to the source contact resistance may be greater than 5.

Figure 7:
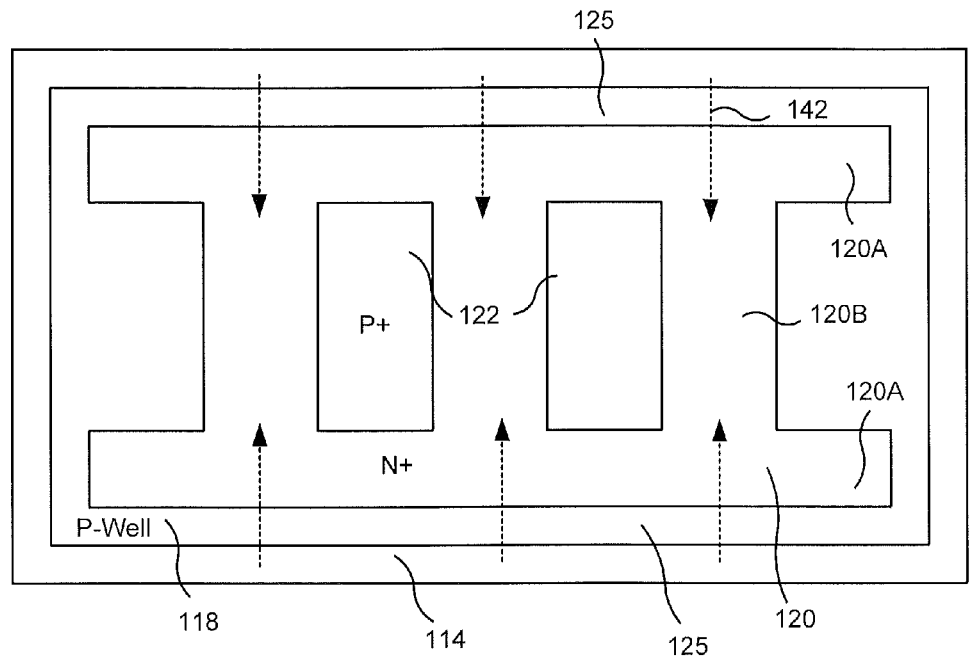
FIGS. 7 and 8 are plan views illustrating layouts of power MOSFET devices according to some embodiments.
Figure 8:
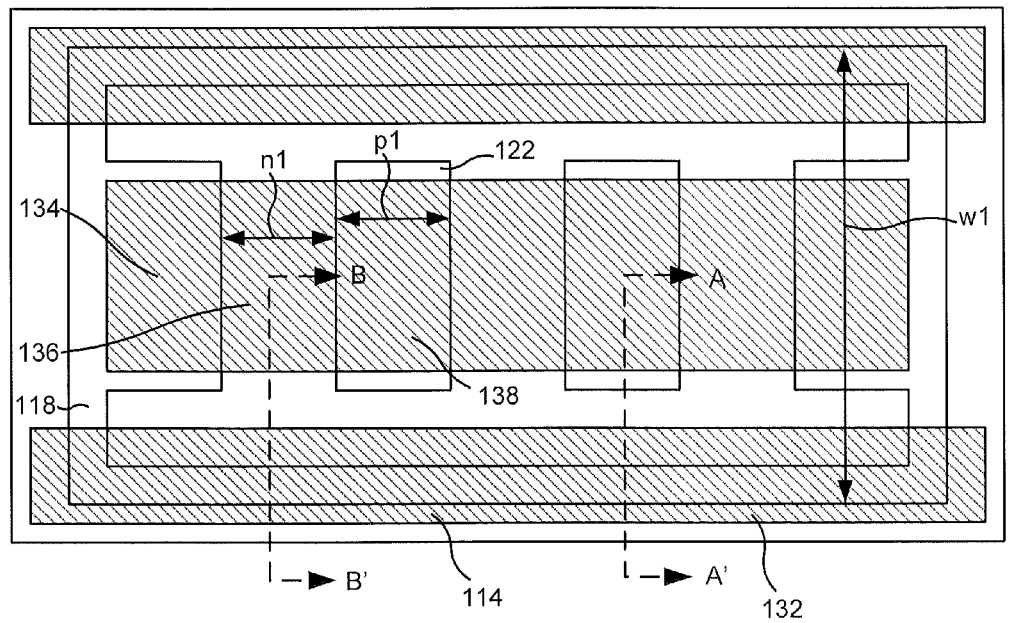
Figure 9:
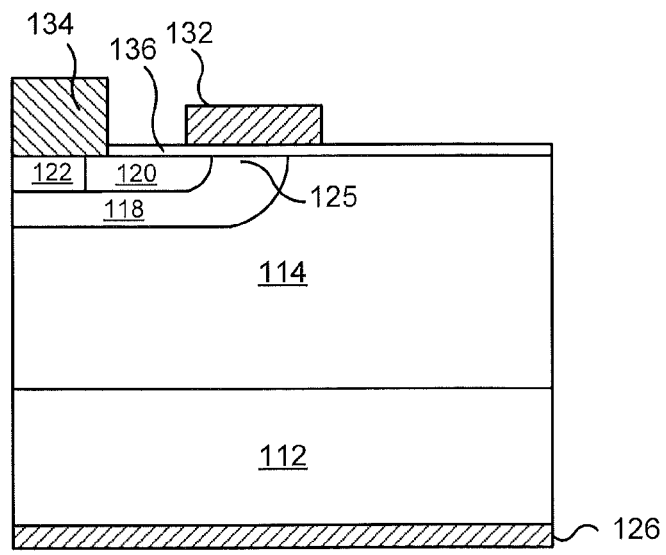
FIGS. 9 and 10 are partial cross sectional illustrations of a cell of a power MOSFET device according to some embodiments.
Figure 10:
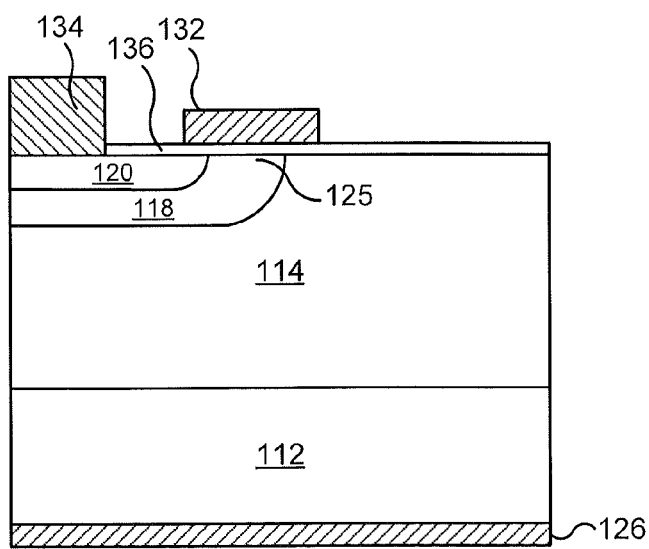

FIGS. 7 and 8 are plan views illustrating layouts of MOSFET device cells 100 according to some embodiments, and FIGS. 9 and 10 are partial cross sectional illustrations of a cell of a MOSFET device according to some embodiments. In particular, FIG. 9 is a cross section taken along line A-A' of FIG. 8, while FIG. 10 is a cross section taken along line B-B' of FIG. 8.

The device 100 shown in FIGS. 7-10 includes an n− drift epitaxial layer 114 on an n-type, 8° off-axis 4H—SiC substrate 112. The n− drift layer 114 may have a thickness of about 100 µm to about 120 µm, and may be doped with n-type dopants at a doping concentration of about $2 \times 10^{14}$ cm$^{-3}$ to about $6 \times 10^{14}$ cm$^{-3}$ for a blocking capability of about 10 kV. For a 1200V MOSFET device, the substrate may be 4° off-axis 4H—SiC and the drift layer may have a thickness of about 10 µm and may be doped with n-type dopants at a doping concentration of about $6 \times 10^{15}$ cm$^{-3}$.

The structure further includes a p+ well region 118 and an n+ source region 120 that may be formed by selective implantation of, for example, aluminum and nitrogen, respectively. The junction depth of the p+ well region 118 may be about 0.5 µm. The structure 100 further includes a plurality of p+ contact regions 122 that extend from a surface of the drift layer 114 into the p+ well region 118. A junction termination (not shown) may be provided around the device periphery.

Referring to FIG. 7, the n+ source region 120 includes a pair of lateral source regions 120A that are parallel to opposing channel regions 125 in the p-well 118. A plurality of source contact regions 120B extend between the lateral source regions 120A, and the plurality of p+ contact regions 122 are provided between the source contact regions 120B.

Referring to FIG. 8, gate contacts 132 are formed over the channel regions 125 and overlap the lateral source regions 120A. A source ohmic contact 134 is formed across the source contact regions 120B and the p+ contact regions 122. The source ohmic contact 134 overlaps the source contact regions 120B in an n-type contact region 136. The source ohmic contact 134 overlaps the p+ contact regions 122 in a body contact region 138.

The portion of the source contact regions 120B contacted by the source ohmic contact 134 may have a minimum dimension that is larger than the minimum dimension that can be obtained for a conventional layout such as the layout shown in FIGS. 5 and 6 for a similar pitch/p-well size. Accordingly, the source contact resistance may be reduced without substantially increasing the device pitch/p-well size. The "minimum dimension" of a feature refers to the smallest width of the feature in any cross section of the feature. For example, the minimum dimension p1 of the body contact region 138, the minimum dimension n1 of the n-type contact region 136 and the minimum dimension w1 of the p-well region 118 are shown in FIG. 8.

In a device having a layout as shown in FIGS. 7 and 8, current flow to the source contact flows through the source contact regions 120B, as indicated by the arrows 142 in FIG. 7. The source contact regions 120B may have an increased sheet resistance compared to the source region of a device having a conventional layout as shown in FIGS. 5 and 6. However, the increase in sheet resistance may be more than compensated by the decrease in contact resistance, thus providing an overall decrease in the source resistance of the device.

Figure 11:
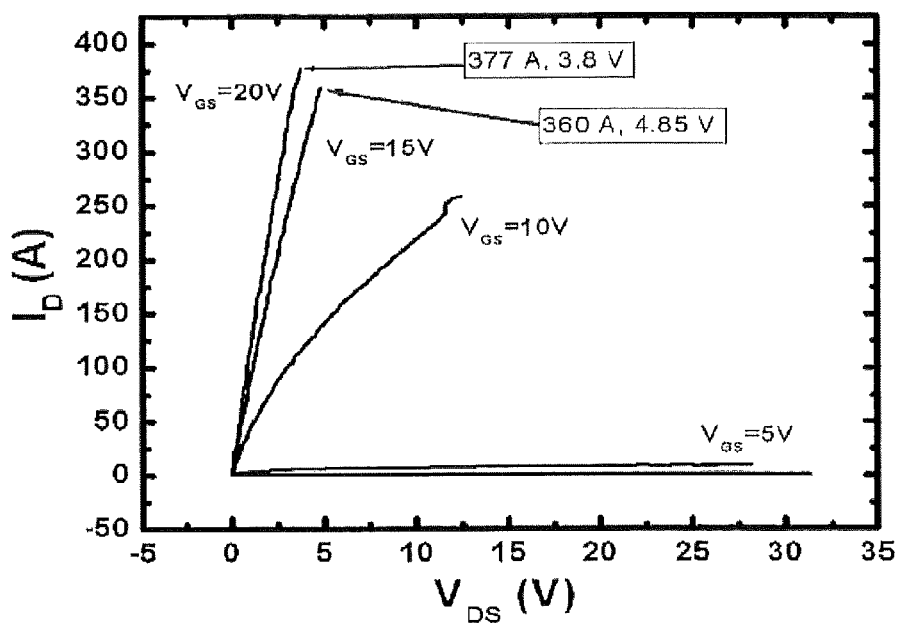
FIG. 11 is a graph on-state current-voltage characteristics for a MOSFET device according to some embodiments.

FIG. 11 is a graph of on-state current-voltage characteristics for a 7 mm×8 mm 1200 V silicon carbide MOSFET device according to some embodiments. In the device characteristics illustrated in FIG. 11, a drain current ($I_D$) of 377 A was measured at a forward voltage drain-to-source voltage ($V_{DS}$) of 3.8 V. The current density, normalized to the active area, was over 750 A/cm².

The on-resistance of a MOSFET device is affected by the drain resistance, the channel resistance and the source resistance of the device. Accordingly, reducing the source resistance of the device also reduces the on-resistance of the device.

A wide bandgap MOSFET device having a layout according to some embodiments may be capable of substantially increased saturation current due to the lower on-resistance of the device and the fact that increased current levels have less of a de-biasing effect on the gate. That is, because of the lower source resistance, less voltage will be developed over the source resistance as the drain current increases. Thus, more of the gate-to-source voltage is applied to the channel of the device.

Figure 12:
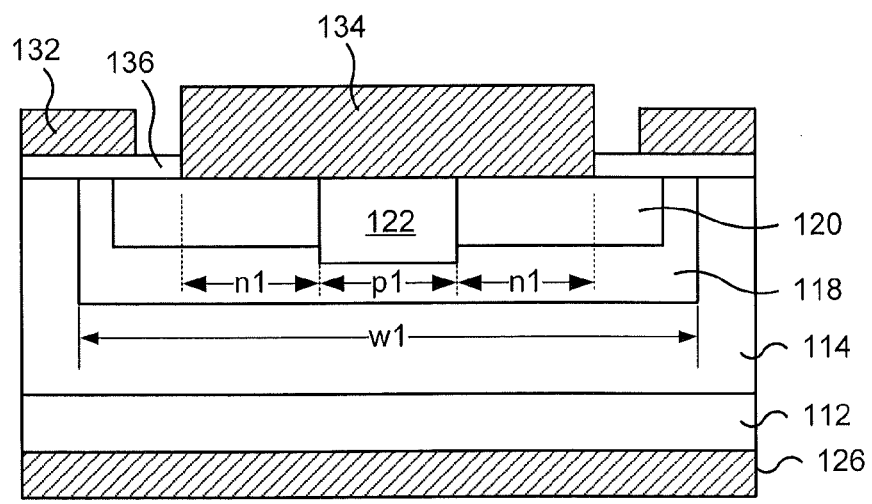
FIG. 12 is a cross sectional illustration of cell of a power MOSFET device according to some embodiments.

FIG. 12 is an idealized cross section of a device having a layout in accordance with some embodiments. In particular, FIG. 12 illustrates some dimensions of a device having a layout in accordance with some embodiments. For example, as shown in FIG. 12, the minimum dimension of the implanted cell area (i.e. the p-well 118) is denoted as width w1 in FIG. 12. It will be appreciated, however, that the minimum dimension of the p-well 118 may occur in a dimension that is different from the plane of the device illustrated in FIG. 12. For example, the minimum dimension of the p-well 118 may occur in a dimension that is perpendicular to the plane of the device illustrated in FIG. 12.

The minimum dimension of the n-type contact area is denoted as width n1 in FIG. 12, while the minimum dimension of the p-type contact area is denoted as width p1 in FIG. 12. The n-type contact area may be defined as the area of overlap between the source ohmic contact 132 and the n+ source region 120, while the p-type contact area may be defined as the area of overlap between the source ohmic contact 132 and the p+ contact regions 122.

Figure 13:
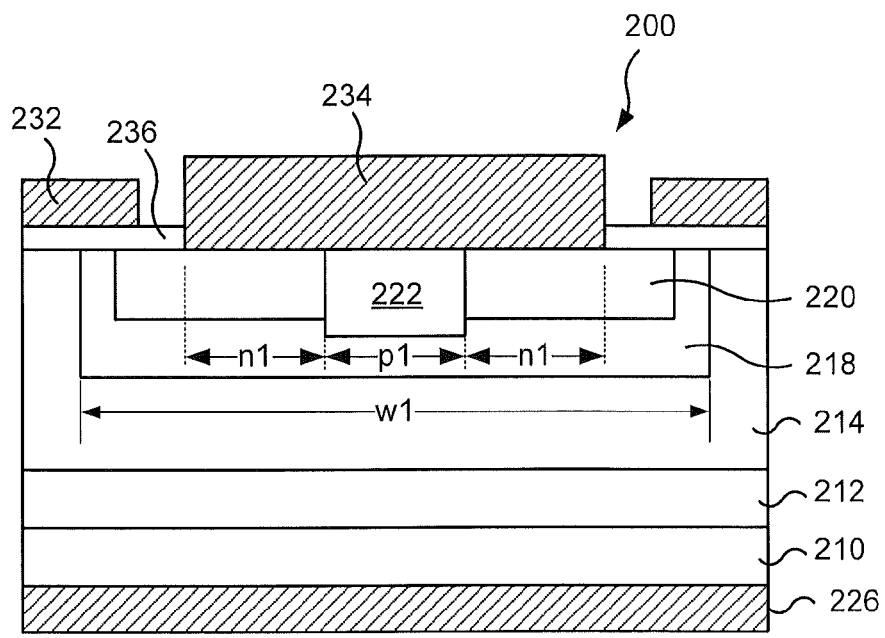
FIG. 13 is a cross sectional illustration of cell of an insulated gate bipolar transistor device according to some embodiments.

An insulated gate bipolar transistor (IGBT) device 200 according to some embodiments is illustrated in FIG. 13. As shown therein, the IGBT device includes an n− drift epitaxial layer 214 on a p-type epitaxial layer 212. The p-type epitaxial layer 212 is formed on a heavily doped p-type, 8° off-axis 4H—SiC substrate or layer 210. The n− drift layer 214 may have a thickness of about 100 μm to about 120 μm, and may be doped with p-type dopants at a doping concentration of about $2×10^{14}$ cm⁻³ to about $6×10^{14}$ cm⁻³ for a blocking capability of about 10 kV.

The IGBT structure 200 further includes a p+ well region 218 and an n+ source/emitter region 220 that may be formed by selective implantation of, for example, aluminum and nitrogen, respectively. The junction depth of the p+ well region 218 may be about 0.5 μm. The structure 200 further includes a plurality of p+ body contact regions 222 that extend from a surface of the drift layer 214 into the p+ well region 218. The conductivity types may be reversed in some embodiments.

A gate contact 232 is on a gate insulator 236, a source/emitter contact 234 is on the source contact regions 220 and the body contact regions 222. A collector contact 226 contacts the substrate 210.

According to some embodiments, a transistor device may have a ratio of n1 to w1 that is greater than 0.2. In further embodiments, a transistor device may have a ratio of n1 to w1 that is greater than about 0.3. In further embodiments, a transistor device may have a ratio of n1 to w1 that is in the range of about 0.2 to 1. In further embodiments, a transistor device may have a ratio of n1 to w1 that is in the range of about 0.3 to 1. In further embodiments, transistor device may have a ratio of n1 to w1 that is greater than 0.5. For example, the minimum dimension n1 of the n-type contact area of a device having a layout according to some embodiments may be about 2 μm for a device having a minimum dimension of the implanted cell area of 6 μm.

According to some embodiments, a transistor device may have a ratio of p1 to w1 that is greater than 0.2. In further embodiments, a transistor device may have a ratio of p1 to w1 that is greater than about 0.3. In further embodiments, a transistor device may have a ratio of p1 to w1 that is greater than about 0.5. In further embodiments, a transistor device may have a ratio of p1 to w1 that is in the range of about 0.2 to 0.5. In further embodiments, a transistor device may have a ratio of p1 to w1 that is in the range of about 0.2 to 1.

Some embodiments provide transistor devices having increased current densities. Current density is defined as the total current divided by the area of the chip. For example, a wide bandgap transistor device according to some embodiments may be capable of current densities in excess of 200 A/cm² and a blocking voltage of 1000 V or more. A wide bandgap transistor device according to further embodiments may be capable of a current of 100 A or greater at current densities in excess of 200 A/cm², a forward voltage drop of less than 5 V and a blocking voltage of 1000 V or more. A wide bandgap transistor device according to still further embodiments may be capable of a current of 100 A or greater at current densities in excess of 300 A/cm², a forward voltage drop of less than 5 V and a blocking voltage of 1000 V or more.

A semiconductor device according to some embodiments has a reverse blocking voltage in excess of 1000 volts and a current density greater than 200 amps per square centimeter at a current greater than 100 A.

A semiconductor device according to further embodiments has a reverse blocking voltage of 1000 volts or more and a forward current capability greater than 100 A at a forward voltage of 5 volts or less.

A metal-oxide semiconductor field effect transistor device according to some embodiments has a reverse blocking voltage of 1200 volts or more and a forward current capability greater than 100 A.

A metal-oxide semiconductor field effect transistor device according to some embodiments has a reverse blocking voltage of 1000 volts or more and a differential on-resistance less than 8 mOhms-cm².

A semiconductor device having a blocking voltage less than 1000 V and configured to pass forward current at a current density greater than 200 amps per square centimeter at a forward voltage drop of 5 V or less.

Some embodiments may enable wide bandgap transistor devices to achieve drain currents of 100 Amps or higher at a drain to source voltage that is less than 4 Volts in a device having a cell pitch of less than 20 µm. Some embodiments may enable wide bandgap transistor devices to achieve drain currents of 100 Amps or higher at a drain to source voltage that is less than 4 Volts in a device having a cell pitch of less than 10 µm. Some embodiments may enable wide bandgap transistor devices to achieve drain currents of 80 Amps or higher at a drain to source voltage that is less than 5 Volts in a device having a cell pitch of less than 10 µm.

An IGBT device according to some embodiments with a voltage blocking capability of 10 kV or greater may have a differential specific on-resistance of less than 14 mOhm-cm² with a forward voltage drop of 5.2 V or less at a current density of 100 A/cm².

Figure 14:
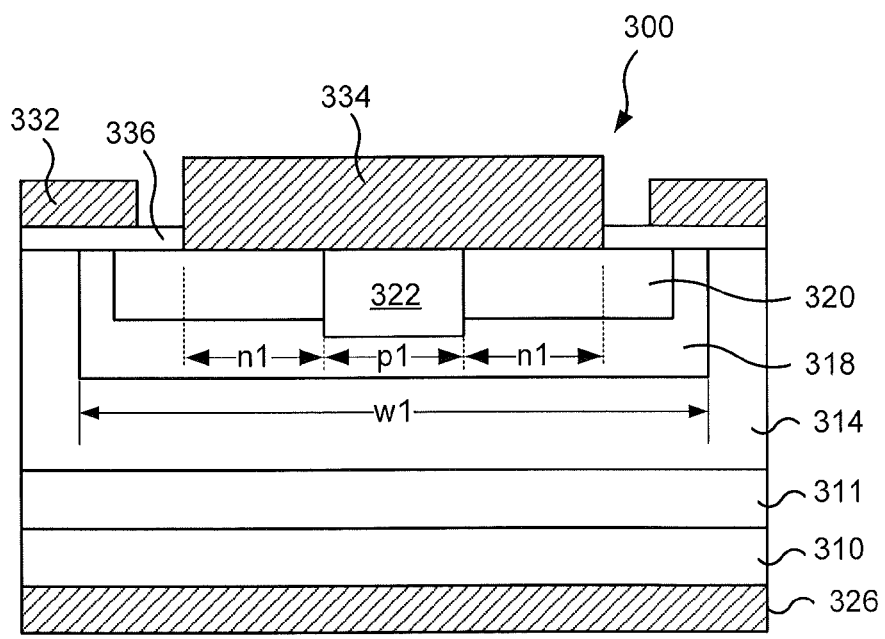
FIG. 14 is a cross sectional illustration of cell of a p-type insulated gate bipolar transistor device according to some embodiments.

A p-type insulated gate bipolar transistor (p-IGBT) device 300 according to some embodiments is illustrated in FIG. 14. As shown therein, the IGBT device includes a p− drift epitaxial layer 314 on a p-type field stop buffer layer 311 formed on an n-type, 8° off-axis 4H—SiC substrate 310. The p− drift layer 314 may have a thickness of about 100 µm to about 200 µm, and may be doped with p-type dopants at a doping concentration of about $2 \times 10^{14}$ cm$^{-3}$ to about $6 \times 10^{14}$ cm$^{-3}$.

The p-IGBT structure 300 further includes an n+ well region 318 and a p+ source/emitter region 320 that may be formed by selective implantation of, for example, nitrogen and aluminum, respectively. The junction depth of the n+ well region 318 may be about 0.5 µm. The structure 300 further includes a plurality of n+ body contact regions 322 that extend from a surface of the drift layer 314 into the n+ well region 318.

A gate contact 332 is on a gate insulator 336, a source/emitter contact 334 is on the source contact regions 320 and the body contact regions 322. A collector contact 326 contacts the substrate 310.

A 4H—SiC p-IGBT as shown in FIG. 14 was fabricated using a $2 \times 10^{14}$ cm$^{-3}$ doped, 140 µm thick p-type epilayer as the drift layer 314, and a 2 µm thick p-type Field-Stop buffer layer 311, with a doping concentration ranging from $1 \times 10^{17}$ cm$^{-3}$ to $5 \times 10^{17}$ cm$^{-3}$. A multi-zone JTE (15 zone) edge termination structure (not shown) was formed by nitrogen ion implantation. JTE terminations are described, for example, in U.S. Pat. No. 6,002,159, which is incorporated herein by reference. MOS channels were formed on implanted n-wells 318. A 50 nm thick thermally grown oxide layer was used as the gate insulator 336.

Figure 15:
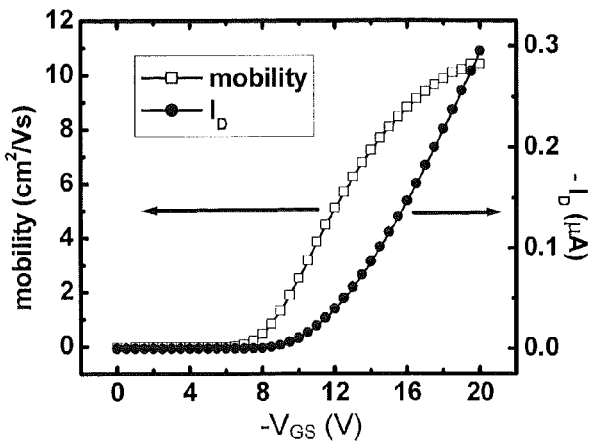
FIG. 15 is a graph showing current-voltage characteristics of the P-IGBT device of FIG. 14.

FIG. 15 shows the $I_D$-$V_{GS}$ characteristics of the p-IGBT device shown in FIG. 14, with $V_{DS}$ fixed at −50 mV. The $I_D$-$V_{GS}$ characteristics were measured from a test MOSFET with a W/L of 200 µm/200 µm, fabricated on the same wafer. A threshold voltage of −10 V, and a peak MOS channel mobility of 10 cm²/Vs were extracted from the $I_D$-$V_{Gs}$ characteristics.

Figure 16:
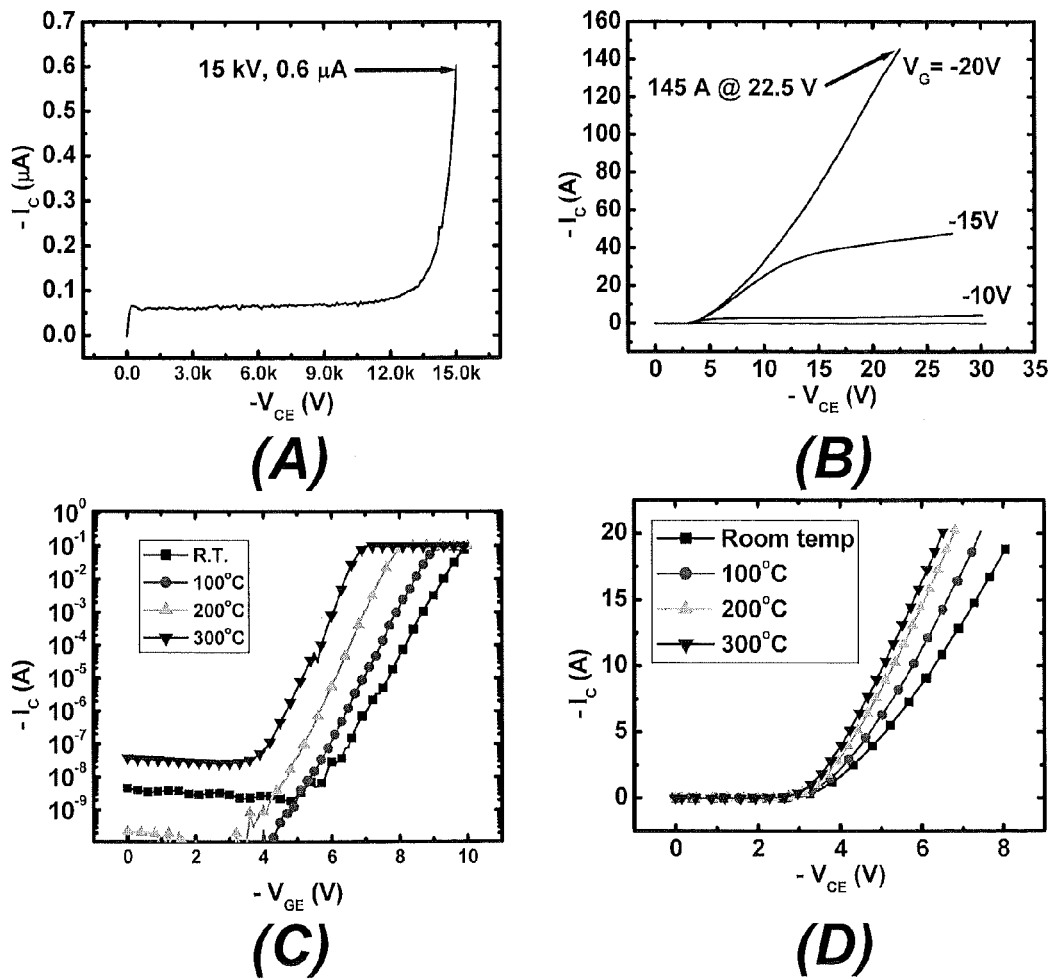
FIG. 16A is a graph showing voltage blocking characteristics of the p-IGBT of FIG. 14.
FIG. 16B is a graph showing pulsed on-state current-voltage characteristics of the P-IGBT of FIG. 14.
FIG. 16C is a graph showing further on-state current-voltage characteristics of the P-IGBTs of FIG. 14 for temperatures ranging from room temperature to 300° C.
FIG. 16D is a graph showing on-state current-voltage characteristics of the P-IGBTs of FIG. 14 as a function of temperature.

FIG. 16A shows the blocking characteristics ($V_{GE}$=0 V) of a 6.7 mm×6.7 mm 4H—SiC P-IGBT, with an active area of 0.16 cm² at room temperature. The measurement voltage was limited to −15 kV, due to the limitation of probing equipment. The device showed a leakage current of 0.6 µA, which corresponds to a leakage current density of 1.2 µA/cm² at a $V_{CE}$ of −15 kV. This is the highest blocking voltage ever reported in SiC power switches. FIG. 16B shows the pulsed on-state I-V characteristics of the p-IGBT, measured using a Tektronix 371 curve tracer. The device showed an on-state current of −145 A, which represents a current density of 906 A/cm², at a $V_{CE}$ of −22.5 V and a $V_{GE}$ of −20 V. No evidence of parasitic thyristor latch-up was observed during this measurement.

FIG. 16C shows $I_C$-$V_{GE}$ characteristics of the 4H—SiC P-IGBTs for temperatures ranging from room temperature to 300° C. $V_{CE}$ was fixed at −10V for this measurement. The I-V characteristics shifted towards zero at elevated temperature. However, the device maintained normally-off properties throughout the temperature range. FIG. 16D shows the on-state I-V characteristics as a function of temperature. $V_{GE}$ was fixed at −20 V for this measurement. A monotonic decrease in forward voltage drop with increasing temperature was observed. This is believed due to the increase in minority carrier (electron) diffusion length, caused by increased carrier lifetime at elevated temperatures.

Accordingly, a p-IGBT according to some embodiments may have a reverse blocking voltage that is greater than about 10 kV, and in some cases greater than about 13 kV, and that has a forward current capability greater than 5 Amps.

It will be appreciated that although some embodiments of the invention have been described in connection with silicon carbide IGBT and MOSFET devices having n-type drift layers, the present invention is not limited thereto, and may be embodied in devices having p-type substrates and/or drift layers. Furthermore, the invention may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. A semiconductor device comprising:
a channel region extending in a first direction;
a lateral source region adjacent and parallel to the channel region;
a plurality of source contact regions of a first conductivity type laterally adjacent to and arranged in a layout with first and second contact regions, the first and second contact regions having a second conductivity type; and
a source ohmic contact that extends in the first direction across the plurality of source contact regions and the first and second contact regions; wherein the source ohmic contact directly contacts each source contact region and each of the first and second contact regions of the layout; and
wherein the plurality of source contact regions and the first and second contact regions extend in a second direction perpendicular to the first direction, the plurality of source contact regions are in electrical contact with the lateral source region, and the source ohmic contact is spaced apart from the lateral source region in the second direction,
wherein the channel region and the lateral source region comprises a wide bandgap semiconductor material having a bandgap greater than about 2.0 V.
2. The semiconductor device of claim 1, wherein a minimum dimension of an area of contact of the source ohmic contact on the plurality of source contact regions is such that the semiconductor device has a reverse blocking voltage of 1000 volts or more and the device is capable of a forward current greater than 100 A at a forward voltage of 5 volts or less.

3. The semiconductor device of claim 1, wherein the semiconductor device comprises a metal-oxide semiconductor field effect transistor device having a reverse blocking voltage of 1200 volts or more.

4. The semiconductor device of claim 1, wherein a minimum dimension of an area of the source ohmic contact on the plurality of source contact regions is arranged in the layout such that the semiconductor device has a blocking voltage less than 1000 V and is configured to pass forward current at a current density greater than 200 amps per square centimeter at a forward voltage drop of 5 V or less.

5. The semiconductor device of claim 1, wherein the plurality of source contact regions is arranged in the layout with the source ohmic contact and the first and second contact regions such that a ratio of sheet resistance in ohms per square of the plurality of source contact regions to contact resistance in ohms per square area is greater than 1, wherein the square is equal in size to the square area.

6. The semiconductor device of claim 1, wherein the plurality of source contact regions is arranged in the layout with the source ohmic contact and the first and second contact regions to have a sheet resistance in ohms per square greater than 75% of a contact resistance hi ohms per square area such that the semiconductor device has a reverse blocking voltage in excess of 1000 volts and a current density greater than 200 amps per square centimeter at a current greater than 100 A, wherein the square is equal in size to the square area.

7. The semiconductor device of claim 1, wherein the plurality of source contact regions is arranged in the layout with the source ohmic contact and the first and second contact regions such that a sheet resistance in ohms per square of the plurality of source contact regions is greater than a contact resistance in ohms per square area of the plurality of source contact regions, wherein the square is equal in size to the square area.

8. The semiconductor device of claim 1, wherein the plurality of source contact regions is arranged in the layout with the source ohmic contact and the first and second contact regions such that a sheet resistance in ohms per square of the plurality of source contact regions is at least 5 times greater than a contact resistance in ohms per square area of the plurality of source contact regions, wherein the square is equal in size to the square area.

9. The semiconductor device of claim 1, wherein the plurality of source contact regions has a sheet resistance and the source ohmic contact has a contact resistance, wherein the contact resistance in ohms per square area is greater than the sheet resistance in ohms per area, wherein the square is equal in size to the square area.

10. The semiconductor device of claim 1, further comprising a source region including the lateral source region and the source contact regions, wherein the source region is arranged in the layout to surround the first and second body contact regions.

11. The semiconductor device of claim 10, wherein the source region is arranged in the layout to surround the first and second body contact regions at a same level as the plurality of contact regions.

12. The semiconductor device of claim 1, wherein a cell pitch of the semiconductor device is less than 10 μm.

13. The semiconductor device of claim 1, wherein the layout comprises a number of source contact regions contacting the source ohmic contact that is one greater than a number of contact regions contacting the source ohmic contact.

14. The semiconductor device of claim 1, wherein the number of source contact regions contacting the source ohmic contact is three and the number of contact regions contacting the source ohmic contact is two.

15. The semiconductor device of claim 1, wherein a minimum dimension of an area of contact between the source ohmic contact on the plurality of source contact regions is arranged in the layout such that the semiconductor device has a reverse blocking voltage in excess of 1000 volts and a current density greater than 200 amps per square centimeter at a current greater than 100 A.

16. The semiconductor device of claim 1, wherein the plurality of contact regions are arranged in the layout with the plurality of source contact regions such that the first and second body contact regions are not physically contacting each other.

17. The semiconductor device of claim 1, wherein a minimum dimension of an area of the source ohmic contact on the plurality of source contact regions is arranged in a layout such that the semiconductor device has a reverse blocking voltage in excess of 1000 volts and a current density greater than 200 amps per square centimeter at a current greater than 100 A.

18. A semiconductor device comprising:
a channel region extending in a first direction;
a lateral source region adjacent and parallel to the channel region;
a plurality of source contact regions of a first conductivity type laterally adjacent to and arranged in a layout with first and second contact regions, the first and second contact regions having a second conductivity type; and
a source ohmic contact that extends in the first direction across the plurality of source contact regions and the first and second contact regions; wherein the source ohmic contact directly contacts each source contact region and each of the first and second contact regions of the layout; and
wherein the plurality of source contact regions and the first and second contact regions extend in a second direction perpendicular to the first direction, the plurality of source contact regions are in electrical contact with the lateral source region, and the source ohmic contact is spaced apart from the lateral source region in the second direction,
wherein the channel region and the lateral source region comprises a wide bandgap semiconductor material having a bandgap greater than about 2.0 V.

19. A semiconductor device comprising:
a channel region extending in a first direction;
a lateral source region adjacent and parallel to the channel region;
a plurality of source contact regions of a first conductivity type laterally adjacent to and arranged in a layout with first and second contact regions, the first and second contact regions having a second conductivity type; and
a source ohmic contact that extends in the first direction across the plurality of source contact regions and the first and second contact regions; wherein the source ohmic contact directly contacts each source contact region and each of the first and second contact regions of the layout; and
wherein the plurality of source contact regions and the first and second contact regions extend in a second direction perpendicular to the first direction, the plurality of source contact regions are in electrical contact with the lateral source region, and the source ohmic contact is spaced apart from the lateral source region in the second direction, wherein the channel region and the lateral source region comprises a wide bandgap semiconductor material having a bandgap greater than about 2.0 V.

20. The insulated gate bipolar transistor device of claim 19, wherein a minimum dimension of an area of the source ohmic contact on the plurality of source contact regions is arranged in the layout such that the insulated gate bipolar transistor device has a blocking voltage of 13 kV or more and the insulated gate bipolar transistor device is capable of a forward current of 5 A or greater.

21. The insulated gate bipolar transistor device of claim 19, wherein the insulated gate bipolar transistor device has a specific on-resistance of less than 14 mOhm-cm$^2$.

22. The insulated gate bipolar transistor device of claim 21, wherein the insulated gate bipolar transistor device has a voltage blocking capability of 10 kV or more.

23. A semiconductor device comprising:
a channel region extending in a first direction;
a lateral source region adjacent and parallel to the channel region;
a plurality of source contact regions of a first conductivity type laterally adjacent to and arranged in a layout with first and second contact regions, the first and second contact regions having a second conductivity type; and
a source ohmic contact that extends in the first direction across the plurality of source contact regions and the first and second contact regions; wherein the source ohmic contact directly contacts each source contact region and each of the first and second contact regions of the layout; and
wherein the plurality of source contact regions and the first and second contact regions extend in a second direction perpendicular to the first direction, the plurality of source contact regions are in electrical contact with the lateral source region, and the source ohmic contact is spaced apart from the lateral source region in the second direction,
wherein the channel region and the lateral source region comprises a wide bandgap semiconductor material having a bandgap greater than about 2.0 V.

24. The metal-oxide semiconductor field effect transistor device of claim 23, wherein the cell pitch is less than 10 μm.

25. A semiconductor device comprising:
a channel region extending in a first direction;
a lateral source region adjacent and parallel to the channel region;
a plurality of source contact regions of a first conductivity type laterally adjacent to and arranged in a layout with first and second contact regions, the first and second contact regions having a second conductivity type; and
a source ohmic contact that extends in the first direction across the plurality of source contact regions and the first and second contact regions; wherein the source ohmic contact directly contacts each source contact region and each of the first and second contact regions of the layout; and
wherein the plurality of source contact regions and the first and second contact regions extend in a second direction perpendicular to the first direction, the plurality of source contact regions are in electrical contact with the lateral source region, and the source ohmic contact is spaced apart from the lateral source region in the second direction,
wherein the channel region and the lateral source region comprises a wide bandgap semiconductor material having a bandgap greater than about 2.0 V.

* * * * *

UNITED STATES PATENT AND TRADEMARK OFFICE
CERTIFICATE OF CORRECTION

PATENT NO.         : 9,142,662 B2
APPLICATION NO.    : 13/108440
DATED              : September 22, 2015
INVENTOR(S)        : Ryu et al.

Page 1 of 1

It is certified that error appears in the above-identified patent and that said Letters Patent is hereby corrected as shown below:

<u>In the Specification</u>:
Column 5, Line 66: please correct "µM," to read -- µm, --

<u>In the Claims</u>:
Column 13, Claim 6, Line 24: Please correct "hi ohms" to read -- in ohms --
Column 13, Claim 10, Line 54: Please correct "second body contact"
　　　　　　　　　　　　　　　　to read -- second contact --
Column 13, Claim 11, Line 58: Please correct "second body contact"
　　　　　　　　　　　　　　　　to read -- second contact --

Column 14, Claim 16, Line 13: Please correct "second body contact"
　　　　　　　　　　　　　　　　to read -- second contact --

Signed and Sealed this
Tenth Day of May, 2016

Michelle K. Lee
*Director of the United States Patent and Trademark Office*